(12) United States Patent
Matsuda

(10) Patent No.: US 9,923,539 B2
(45) Date of Patent: Mar. 20, 2018

(54) ACOUSTIC WAVE DEVICE AND METHOD FOR MANUFACTURING THE SAME

(71) Applicant: TAIYO YUDEN CO., LTD., Tokyo (JP)

(72) Inventor: Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 365 days.

(21) Appl. No.: 14/630,191

(22) Filed: Feb. 24, 2015

(65) Prior Publication Data

US 2015/0256145 A1 Sep. 10, 2015

(30) Foreign Application Priority Data

Mar. 5, 2014 (JP) .................. 2014-043310

(51) Int. Cl.
*H03H 9/25* (2006.01)
*H03H 3/08* (2006.01)
(Continued)

(52) U.S. Cl.
CPC ............. *H03H 3/08* (2013.01); *H03H 3/02* (2013.01); *H03H 9/02992* (2013.01);
(Continued)

(58) Field of Classification Search
CPC ........ H03H 3/08; H03H 3/02; H03H 9/02992; H03H 9/131; H03H 9/25
(Continued)

(56) References Cited

U.S. PATENT DOCUMENTS 5,773,917 A * 6/1998 Satoh ................. H03H 3/08
310/313 A
6,271,617 B1 * 8/2001 Yoneda ............... H03H 9/1452
310/313 D
(Continued)

FOREIGN PATENT DOCUMENTS

JP 7-122961 A 5/1995
JP H10-163789 A 6/1998
(Continued)

OTHER PUBLICATIONS

NPL of Resistivity and Temperature Coefficient at 20 degrees Celsius.*
(Continued)

*Primary Examiner* — Bryan Gordon
(74) *Attorney, Agent, or Firm* — Chen Yoshimura LLP

(57) ABSTRACT

An acoustic wave device includes: a piezoelectric substrate; an interdigital electrode that is provided on the piezoelectric substrate and made of a laminated film, an electric resistivity of a material of an uppermost layer in the laminated film being larger than that of a material of a just-under layer located one layer lower than the uppermost layer; and a pad electrode that is provided on the piezoelectric substrate and electrically connected to the interdigital electrode, and has a same film structure as a film structure from a layer on the piezoelectric substrate to the just-under layer in the laminated film of the interdigital electrode, an upper surface of a layer corresponding to the just-under layer being exposed.

7 Claims, 15 Drawing Sheets

(51) Int. Cl.
*H03H 3/02* (2006.01)
*H03H 9/13* (2006.01)
*H03H 9/02* (2006.01)

(52) U.S. Cl.
CPC ......... *H03H 9/131* (2013.01); *H03H 9/02834* (2013.01); *Y10T 29/42* (2015.01)

(58) Field of Classification Search
USPC ...................................... 310/313 B, 364, 365
See application file for complete search history.

(56) References Cited

U.S. PATENT DOCUMENTS

| | | | | |
|---|---|---|---|---|
| 7,205,700 | B2* | 4/2007 | Yamato | H03H 3/08 29/25.35 |
| 7,868,523 | B2* | 1/2011 | Tanaka | H03H 3/08 310/313 R |
| 2002/0140316 | A1 | 10/2002 | Yamanouchi | |
| 2009/0121584 | A1 | 5/2009 | Nishimura et al. | |
| 2013/0285768 | A1* | 10/2013 | Watanabe | H03H 9/0222 333/193 |

FOREIGN PATENT DOCUMENTS

| | | |
|---|---|---|
| JP | 2003-209458 A | 7/2003 |
| JP | 2005-197595 A | 7/2005 |
| JP | 2007-251710 A | 9/2007 |
| JP | 2010-252321 A | 11/2010 |
| JP | 2011-77682 A | 4/2011 |
| JP | 2012-34418 A | 2/2012 |

OTHER PUBLICATIONS

Mimura et al., "Improvement Technique in Temperature Characteristics of Boundary Acoustic Wave Resonators using Multi-layered Electrodes", Proceedings of Symposium on Ultrasonic Electronics, Nov. 8-10, 2011, vol. 32, pp. 213-214 (Mentioned in paragraph No. 4.).

Japanese Office Action dated Nov. 28, 2017, in a counterpart Japanese patent application No. 2014-043310. (A machine translation (not reviewed for accuracy) attached.).

* cited by examiner

ACOUSTIC WAVE DEVICE AND METHOD FOR MANUFACTURING THE SAME

CROSS-REFERENCE TO RELATED APPLICATION

This application is based upon and claims the benefit of priority of the prior Japanese Patent Application No. 2014-043310, filed on Mar. 5, 2014, the entire contents of which are incorporated herein by reference.

FIELD

A certain aspect of the present invention relates to an acoustic wave device and a method for manufacturing the same, e.g. to an acoustic wave device equipped with an interdigital electrode and a pad electrode on a piezoelectric substrate, and the method for manufacturing the same.

BACKGROUND

There is known an acoustic wave device equipped with an interdigital electrode and a pad electrode on a piezoelectric substrate, as the acoustic wave device using an acoustic wave. The acoustic wave device is used for a bandpass filter and a duplexer in a mobile communication terminal represented by a cellular phone. Recently, low loss of a filter is desired due to the improvement of a reception sensitivity, the reduction of a power consumption and so on of the mobile communication terminal. Factors of an insertion loss include, for example, a propagation loss of the acoustic wave, a leakage of the acoustic wave from a waveguide, a resistance loss of the interdigital electrode, a resistance loss in wiring and the pad electrode, and so on.

In general, the interdigital electrode is made of aluminum (Al) having a small electric resistance and a small density, or an alloy of aluminum. However, using materials other than aluminum and laminating different materials are proposed in view of power durability, characteristics or the like (e.g. see Japanese Patent Application Publication Nos. 7-122961, 2007-251710 and 2003-209458, and Masakazu Mimura et al., "Improvement Technique in Temperature Characteristics of Boundary Acoustic Wave Resonators using Multi-layered Electrodes", Proceedings of Symposium on Ultrasonic Electronics, 2011, vol. 32, pp. 213-214).

Generally, the pad electrode, and the wiring connecting the pad electrode and the interdigital electrode are formed simultaneously with the interdigital electrode in view of the simplification of a manufacturing process. In addition, there is a proposal for making the thickness of the wiring thicker than the interdigital electrode in order to reduce an electric resistance of the wiring (e.g. see Japanese Patent Application Publication No. 2010-252321).

Japanese Patent Application Publication No. 2010-252321 proposes reducing the electric resistance by making the wiring thick, but does not take an electric resistance of the pad electrode in a direction perpendicular to the piezoelectric substrate into consideration.

SUMMARY OF THE INVENTION

According to a first aspect of the present invention, there is provided an acoustic wave device including: a piezoelectric substrate; an interdigital electrode that is provided on the piezoelectric substrate and made of a laminated film, an electric resistivity of a material of an uppermost layer in the laminated film being larger than that of a material of a just-under layer located one layer lower than the uppermost layer; and a pad electrode that is provided on the piezoelectric substrate and electrically connected to the interdigital electrode, and has a same film structure as a film structure from a layer on the piezoelectric substrate to the just-under layer in the laminated metal film of the interdigital electrode, an upper surface of a layer corresponding to the just-under layer being exposed.

According to a second aspect of the present invention, there is provided an acoustic wave device including: a piezoelectric substrate; an interdigital electrode that is provided on the piezoelectric substrate and made of a laminated film, an electric resistivity of a material of an uppermost layer in the laminated film being larger than that of a material of a just-under layer located one layer lower than the uppermost layer; and a pad electrode that is provided on the piezoelectric substrate and electrically connected to the interdigital electrode, and has a same film structure as a film structure from a layer on the piezoelectric substrate to the just-under layer in the laminated metal film of the interdigital electrode, a layer having a material different from a material of the uppermost layer being provided on another layer corresponding to the just-under layer.

According to a third aspect of the present invention, there is provided a method for manufacturing an acoustic wave device, including: forming a laminated film on a piezoelectric substrate, an electric resistivity of a material of an uppermost layer in the laminated film being larger than that of a material of a just-under layer located one layer lower than the uppermost layer; forming, at the same time, an interdigital electrode made of the laminated film, and a metal pattern that is made of the laminated film and electrically connected to the interdigital electrode; and forming a pad electrode electrically connected to the interdigital electrode by removing the uppermost layer of the metal pattern and exposing the just-under layer of the metal pattern.

According to a fourth aspect of the present invention, there is provided a method for manufacturing an acoustic wave device, including: forming a laminated film on a piezoelectric substrate, an electric resistivity of a material of an uppermost layer in the laminated film being larger than that of a material of a just-under layer located one layer lower than the uppermost layer; forming, at the same time, an interdigital electrode made of the laminated film, and a metal pattern that is made of the laminated film and electrically connected to the interdigital electrode; exposing the just-under layer of the metal pattern by removing the uppermost layer of the metal pattern; and forming a pad electrode electrically connected to the interdigital electrode by forming a layer having a material different from a material of the uppermost layer of the metal pattern on the exposed just-under layer of the metal pattern.

DETAILED DESCRIPTION

Figure 1:
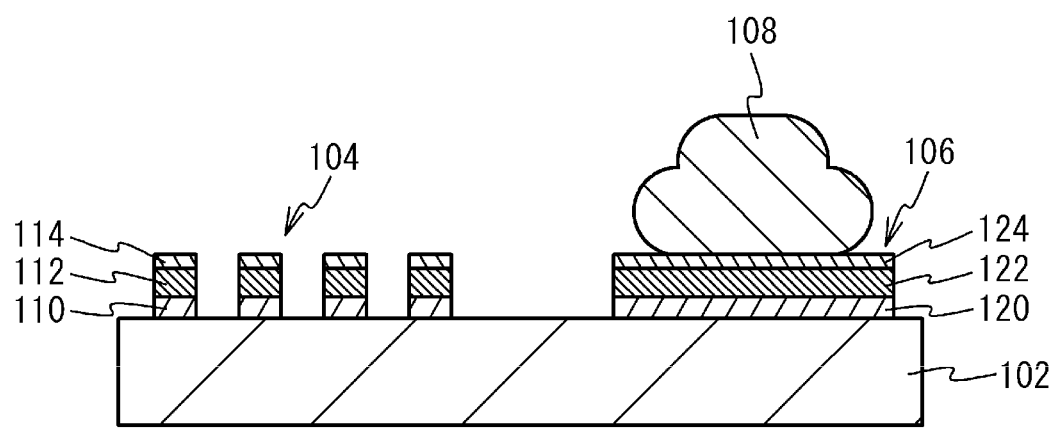
FIG. 1 is a cross-sectional view illustrating an acoustic wave device according to a comparative example 1.

First, a description will be given of an acoustic wave device according to a comparative example. FIG. 1 is a cross-sectional view illustrating the acoustic wave device according to a comparative example 1. In the acoustic wave device of the comparative example 1, an interdigital electrode 104 and a pad electrode 106 electrically connected to the interdigital electrode 104 are provided on a piezoelectric substrate 102, as illustrated in FIG. 1. A bump 108 is provided on the pad electrode 106.

The interdigital electrode 104 is a laminated metal film in which a plurality of metal layers are laminated. For example, a first layer 110, a second layer 112 and a third layer 114 are laminated in this order from the piezoelectric substrate 102. The first layer 110 is made of a titanium (Ti) layer, for example. The second layer 112 is made of a copper (Cu) layer, for example. The third layer 114 is made of a Ti layer, for example.

The pad electrode 106 is formed simultaneously with the interdigital electrode 104 for simplification of a manufacturing process. Therefore, the pad electrode 106 has the same film structure as the interdigital electrode 104. That is, in the pad electrode 106, a first layer 120, a second layer 122 and a third layer 124 are laminated in this order from the piezoelectric substrate 102. The first layer 120 has the same material and the same film thickness as the first layer 110 of the interdigital electrode 104. The second layer 122 has the same material and the same film thickness as the second layer 112 of the interdigital electrode 104. The third layer 124 has the same material and the same film thickness as the third layer 114 of the interdigital electrode 104.

Figure 2:
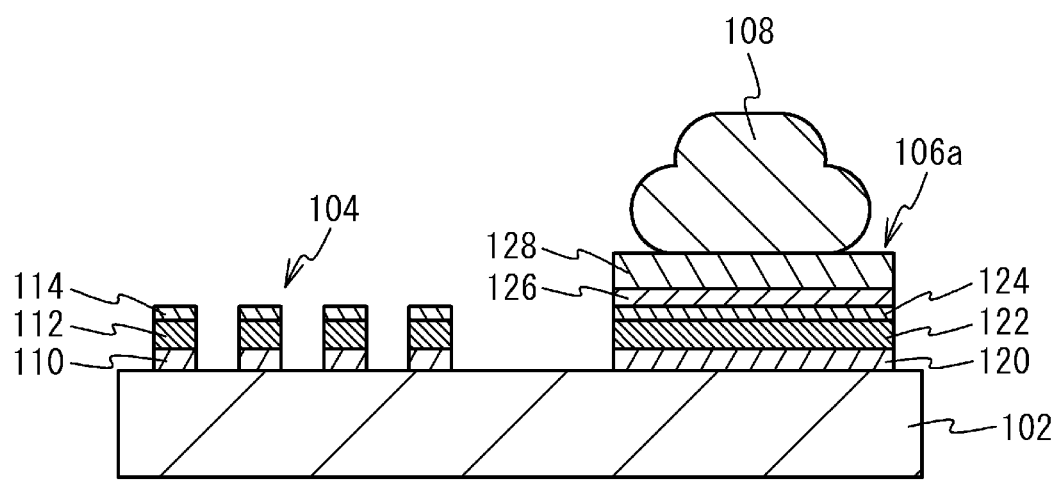
FIG. 2 is a cross-sectional view illustrating an acoustic wave device according to a comparative example 2.

FIG. 2 is a cross-sectional view illustrating an acoustic wave device according to a comparative example 2. In the acoustic wave device of the comparative example 2, a pad electrode 106a is provided with a fourth layer 126 and a fifth layer 128 on the third layer 124 in this order, as illustrated in FIG. 2. The fourth layer 126 is made of a chromium (Cr) layer, for example. The fifth layer 128 is made of a gold (Au) layer, for example. The bump 108 is provided on the fifth layer 128 of the pad electrode 106a. Since other configuration is the same as corresponding configuration in FIG. 1 of the comparative example 1, a description thereof is omitted. When the bump 108 is made of an Au bump, it is desirable that the bump 108 is provided on the fifth layer 128 made of the Au layer in view of adhesion, as illustrated in the comparative example 2.

Figure 3A:
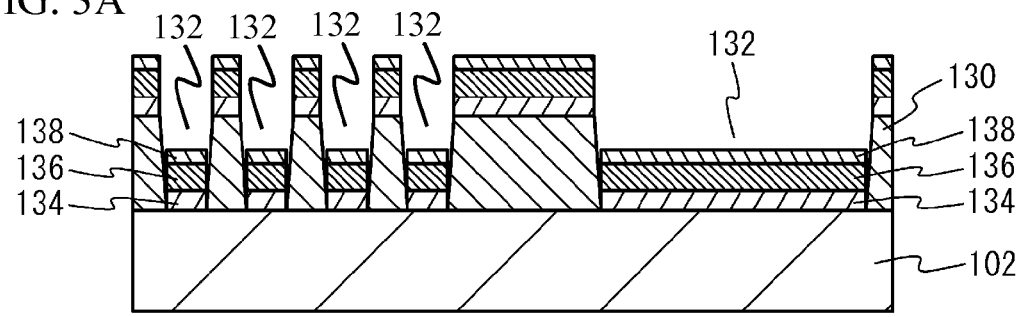
FIGS. 3A to 3D are cross-sectional views illustrating a method for manufacturing the acoustic wave device according to the comparative example 2.

FIGS. 3A to 3D are cross-sectional views illustrating a method for manufacturing the acoustic wave device according to the comparative example 2. A resist pattern 130 has at least openings 132 on regions where the interdigital electrode 104 and the pad electrode 106a should be formed, and the resist pattern 130 is formed on the piezoelectric substrate 102, as illustrated in FIG. 3A. A Ti layer 134, a Cu layer 136 and a Ti layer 138 are deposited on the piezoelectric substrate 102 in this order by using a vapor deposition method, for example. The Ti layer 134, the Cu layer 136 and the Ti layer 138 are formed on the resist pattern 130 and also formed in the openings 132 of the resist pattern 130.

Figure 3B:
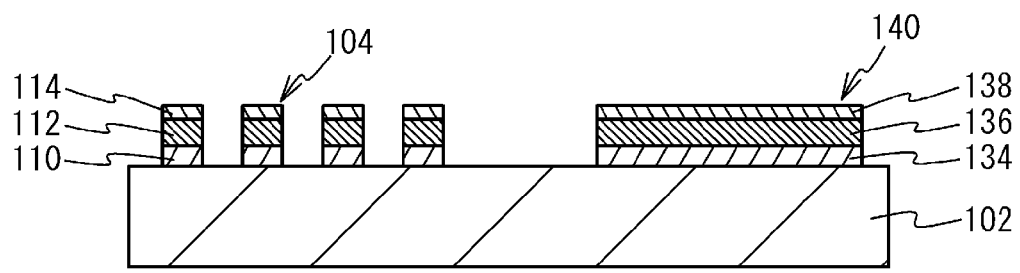

As illustrated in FIG. 3B, the resist pattern 130, and the Ti layer 134, the Cu layer 136 and the Ti layer 138 formed thereon are removed by lift-off. Thereby, the interdigital electrode 104 of the laminated metal film including the first layer 110 of the Ti layer, the second layer 112 of the Cu layer and the third layer 114 of the Ti layer is formed. In addition, a metal pattern 140 of the laminated metal film including the Ti layer 134, the Cu layer 136 and the Ti layer 138 is formed on the region where the pad electrode 106a should be formed, at the same time as the formation of the interdigital electrode 104.

Figure 3C:
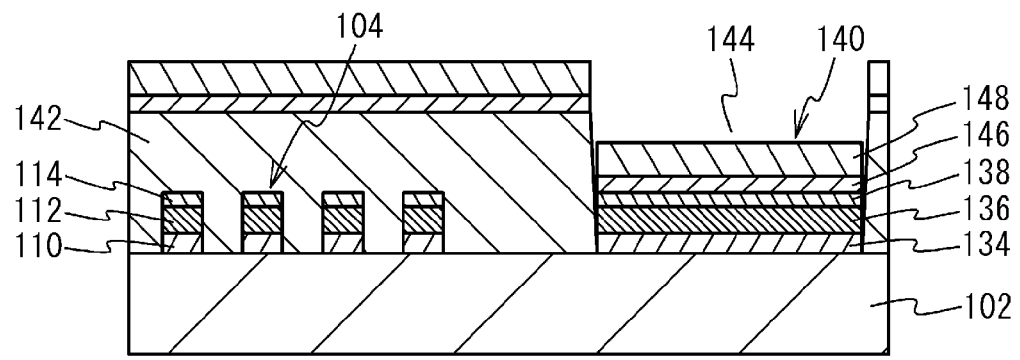

As illustrated in FIG. 3C, a resist pattern 142 having an opening 144 on the metal pattern 140 is formed on the piezoelectric substrate 102. Then, a Cr layer 146 and an Au layer 148 are deposited on the piezoelectric substrate 102 in this order by using the vapor deposition method, for example.

Figure 3D:
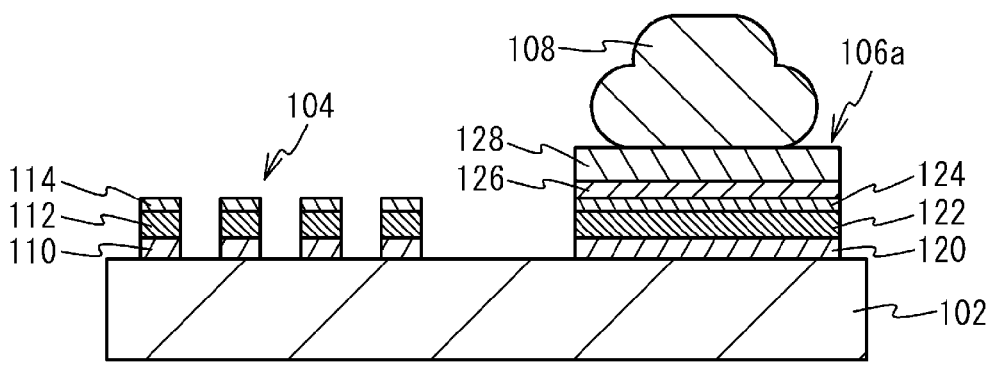

As illustrated in FIG. 3D, the resist pattern 142, and the Cr layer 146 and the Au layer 148 formed thereon are removed by the lift-off. Thereby, the pad electrode 106a of the laminated metal film including the first layer 120 of the Ti layer, the second layer 122 of the Cu layer, the third layer 124 of the Ti layer, the fourth layer 126 of the Cr layer and the fifth layer 128 of the Au layer is formed. Then, the bump 108 is formed on the fifth layer 128 of the pad electrode 106a. The acoustic wave device of the comparative example 2 can be formed by including the above-mentioned process.

Here, the acoustic wave device of the comparative example 1 can be formed by including the following process. By performing the processes of FIGS. 3A and 3B, the interdigital electrode 104 of the laminated metal film including the first layer 110 of the Ti layer, the second layer 112 of the Cu layer and the third layer 114 of the Ti layer is formed, and the pad electrode 106 of the laminated metal film including the first layer 120 of the Ti layer, the second layer 122 of the Cu layer and the third layer 124 of the Ti layer is formed at the same time. Then, the bump 108 is formed on the third layer 124 of the pad electrode 106.

According to the comparative examples 1 and 2, the interdigital electrode 104 and at least a part of pad electrodes 106 and 106a are formed at the same time for simplification of the manufacturing process, and hence they have the same film structure. Therefore, when the materials used for the interdigital electrode 104 are selected in consideration of the power durability, the characteristics or the like, the electric resistance of the pad electrodes 106 and 106a in a direction (i.e., a signal taking direction) perpendicular to the piezoelectric substrate 102 may become large. Hereinafter, a description will be given of embodiments that can suppress the electric resistance of the pad electrode in the direction perpendicular to the piezoelectric substrate.

First Embodiment

Figure 4:
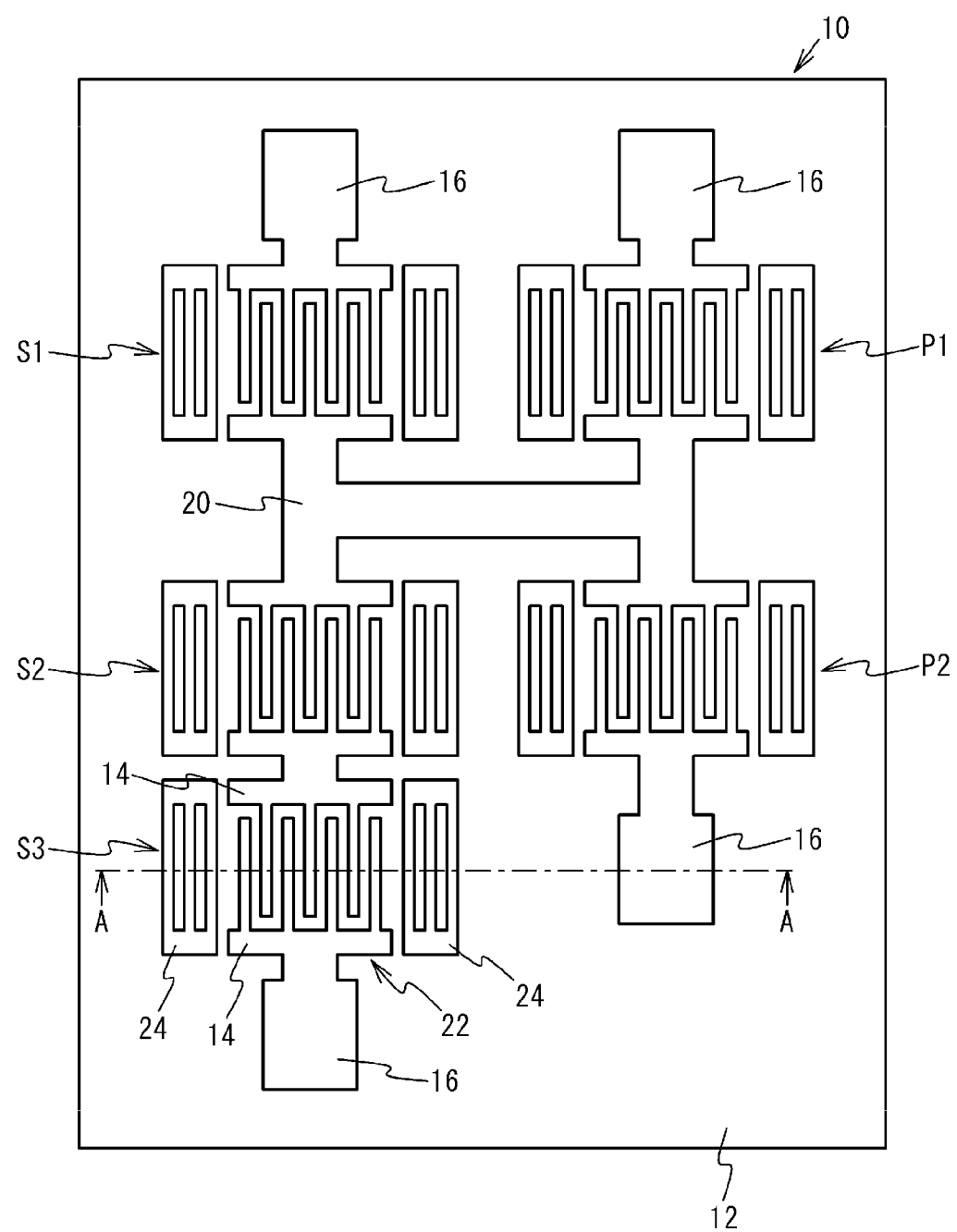
FIG. 4 is a top view illustrating an acoustic wave device according to a first embodiment.

FIG. 4 is a top view illustrating an acoustic wave device according to a first embodiment. As illustrated in FIG. 4, an acoustic wave device 10 of the first embodiment is a ladder type filter in which a plurality of series resonators S1 to S3 and a plurality of parallel resonators P1 and P2 are provided on a piezoelectric substrate 12 made of a piezoelectric material, such as lithium niobate or lithium tantalite.

The series resonators S1 to S3 are connected in series, via a wiring 20, between input/output pad electrodes 16 (i.e., upper-left and lower-left pad electrodes 16) provided on the piezoelectric substrate 12. The parallel resonators P1 and P2 are connected, via the wiring 20, between a node between the series resonators S1 and S2, and ground pad electrodes 16 (i.e., upper-right and lower-right pad electrodes 16) provided on the piezoelectric substrate 12, respectively.

Each of the series resonators S1 to S3 and the parallel resonators P1 and P2 is a surface acoustic wave (SAW) resonator, for example. Each of the series resonators S1 to S3 and the parallel resonators P1 and P2 includes an IDT (Interdigital Transducer) 22 composed of a pair of interdigital electrodes 14 that excite an acoustic wave, and reflectors 24 located at both sides of the IDT 22 in an excitation direction of a surface acoustic wave.

Figure 5:
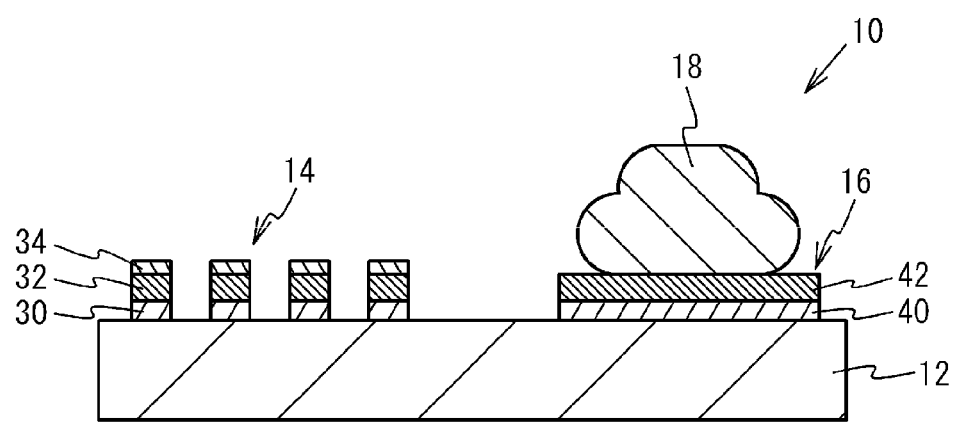
FIG. 5 is a cross-sectional view of the acoustic wave device taken along a line A-A in FIG. 4.

FIG. 5 is a cross-sectional view of the acoustic wave device taken along a line A-A in FIG. 4. Here, in FIG. 5, for the clarity of the figure, the reflectors 24 are omitted, and the number of electrode fingers of the interdigital electrode 14 is also reduced. As illustrated in FIG. 5, the interdigital electrode 14 provided on the piezoelectric substrate 12 is a laminated metal film in which a plurality of metal layers are laminated. For example, a first layer 30 of a Ti layer, a second layer 32 of a Cu layer and a third layer 34 of a Ti layer are laminated in this order from the piezoelectric substrate 12. Each layer has a most suitable film thickness according to a cycle and a characteristic of a filter to be used. In this case, the film thickness of each of the first layer 30 to the third layer 34 is about several tens nanometers to 300 nanometers, for example. The first layer 30 is provided, for example, for adherence with the piezoelectric substrate 12. The second layer 32 is a layer that becomes a main electrode of the interdigital electrode 14, and is made of a material (e.g. Cu) that suppresses the electric resistance of the interdigital electrode 14, for example. The third layer 34 is provided to suppress the oxidation of the second layer 32, for example.

An electric resistivity of Ti which is the material of the first layer 30 and the third layer 34 constituting the interdigital electrode 14 is about 47 to 55 $\mu\Omega\cdot cm$, and the electric resistivity of Cu which is the material of the second layer 32 is about 1.7 $\mu\Omega\cdot cm$. Thus, the interdigital electrode 14 is the laminated metal film in which the electric resistivity of the material (Ti) of the third layer 34 that is an uppermost layer is larger than the electric resistivity of the material (Cu) of the second layer 32 located one layer lower than the uppermost layer.

The pad electrode 16 provided on the piezoelectric substrate 12 is a laminated metal film in which a first layer 40 and a second layer 42 are laminated in this order from the piezoelectric substrate 12, for example. The first layer 40 has the same material and the same film thickness as the first layer 30 of the interdigital electrode 14. The second layer 42 has the same material and the same film thickness as the second layer 32 of the interdigital electrode 14. That is, the first layer 40 is made of a Ti layer having a film thickness of about several tens nanometers to 300 nanometers. The second layer 42 is made of a Cu layer having a film thickness of about several tens nanometers to 300 nanometers. Thus, the pad electrode 16 has the same film structure as the film structure from the layer (i.e., the first layer 30) on the piezoelectric substrate 12 to the second layer 32 in the laminated metal film of the interdigital electrode 14. Then, an upper surface of the second layer 42 corresponding to the second layer 32 of the interdigital electrode 14 is exposed. Here, the same film structure includes a case where the pad electrode 16 is formed by films made of the same materials as the films of the interdigital electrode 14, and a case where the pad electrode 16 is formed by films made of the same materials as the films of the interdigital electrode 14 and having the same thicknesses as the films of the interdigital electrode 14.

A bump 18 for mounting the acoustic wave device 10 on a mounting substrate is provided on an upper surface of the second layer 42 of the pad electrode 16. The bump 18 is, for example, an Au bump, a solder bump, or the like.

Figure 6A:
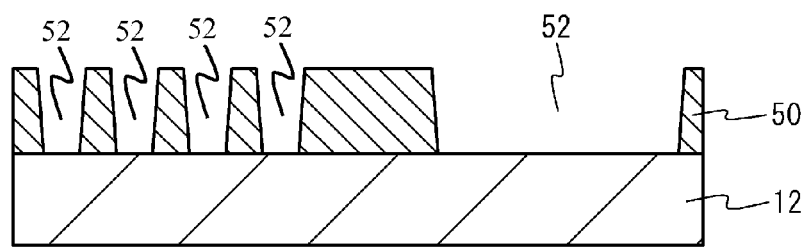
FIGS. 6A to 6D are cross-sectional views illustrating a method for manufacturing the acoustic wave device according to the first embodiment (part 1)

Next, a description will be given of a method for manufacturing the acoustic wave device according to the first embodiment. FIGS. 6A to 7C are cross-sectional views illustrating the method for manufacturing the acoustic wave device according to the first embodiment. As illustrated in FIG. 6A, a resist pattern 50 has openings 52 on regions where the interdigital electrode 14, the reflectors 24, the pad electrode 16 and the wiring 20 should be formed, and covers the other region. The resist pattern 50 is formed on the piezoelectric substrate 12.

Figure 6B:
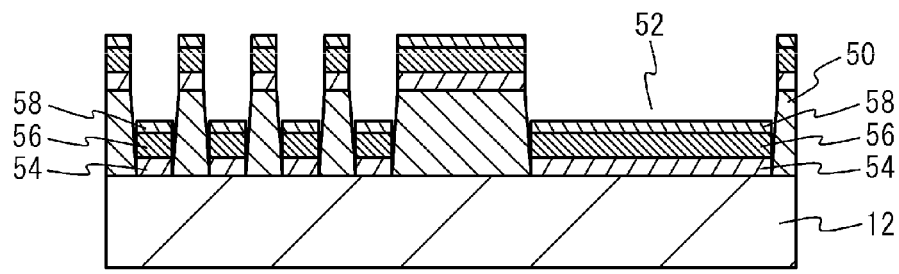

As illustrated in FIG. 6B, a Ti layer 54, a Cu layer 56 and a Ti layer 58 are deposited on the piezoelectric substrate 102 in this order by using the vapor deposition method, for example. The Ti layer 54, the Cu layer 56 and the Ti layer 58 are formed on the resist pattern 50, and are also formed in the openings 52 of the resist pattern 50.

Figure 6C:
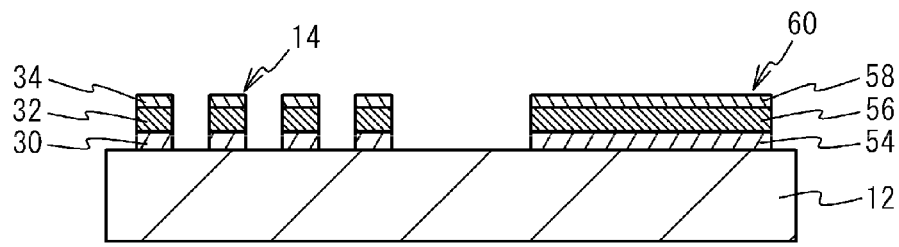

As illustrated in FIG. 6C, the resist pattern 50, and the Ti layer 54, the Cu layer 56 and the Ti layer 58 formed thereon are removed by the lift-off. Thereby, the interdigital electrode 14 of the laminated metal film including the first layer 30 of the Ti layer, the second layer 32 of the Cu layer and the third layer 34 of the Ti layer is formed. Moreover, the reflectors 24 and the wiring 20, not illustrated, of the laminated metal film including the Ti layer, the Cu layer and the Ti layer are also formed. In addition, a metal pattern 60 which is a laminated metal film including the Ti layer 54, the Cu layer 56 and the Ti layer 58 and electrically connected to the interdigital electrode 14 is formed on a region where the pad electrode 16 should be formed. As described above, since Ti has an electric resistivity larger than Cu, the interdigital electrode 14, the reflectors 24, the wiring 20 and the metal pattern 60 are formed at the same time, and each of them is made of the laminated metal film in which the electric resistivity of the material of the uppermost layer is larger than the electric resistivity of the material of the layer located one layer lower than the uppermost layer.

Figure 6D:
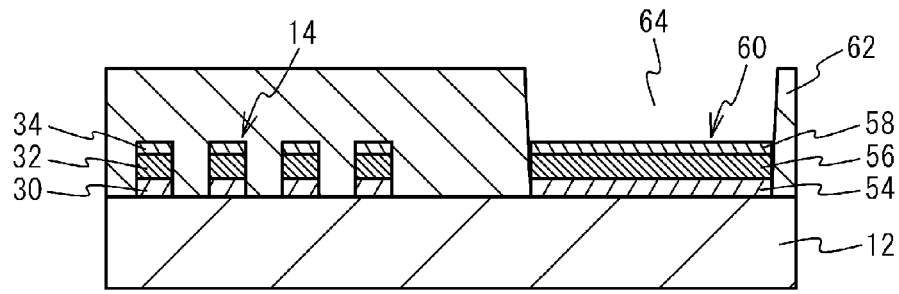

As illustrated in FIG. 6D, a resist pattern 62 has an opening 64 on the metal pattern 60 and covers the other region, and the resist pattern 62 is formed on the piezoelectric substrate 12. The opening 64 of the resist pattern 62 is opened so as to expose the whole upper surface of the metal pattern 60, for example.

Figure 7A:
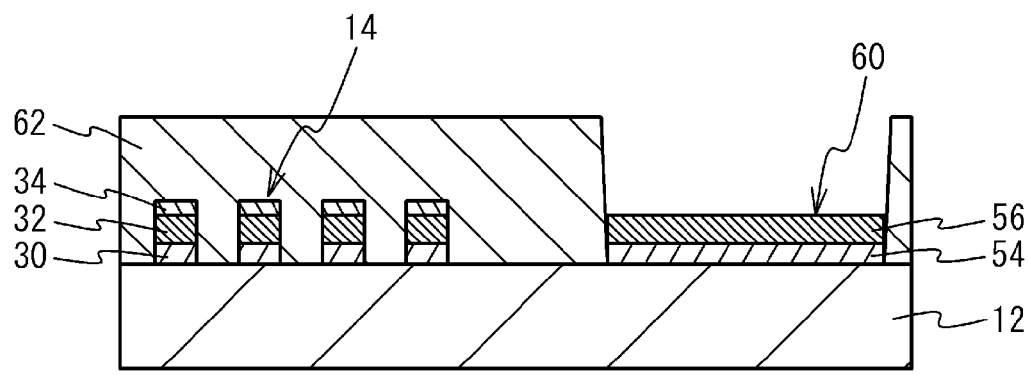
FIGS. 7A to 7C are cross-sectional views illustrating a method for manufacturing the acoustic wave device according to the first embodiment (part 2)

As illustrated in FIG. 7A, etching is performed on the metal pattern 60 using the resist pattern 62 as a mask, the Ti layer 58 which is the uppermost layer is removed, and the Cu layer 56 located one layer lower than the uppermost layer is exposed. The etching may be performed by dry etching or wet etching.

Figure 7B:
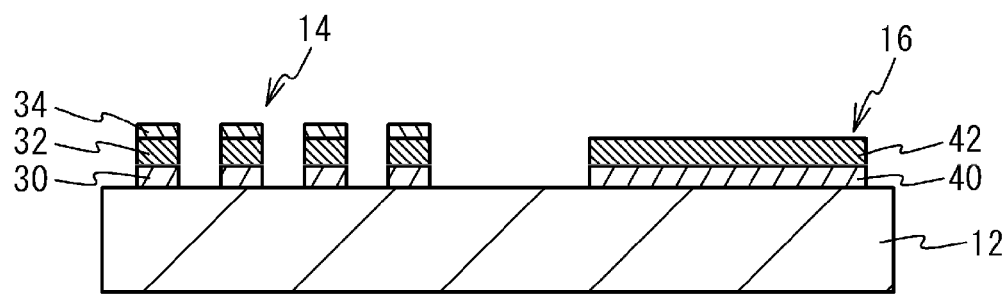

As illustrated in FIG. 7B, the resist pattern 62 is removed. Thereby, the pad electrode 16 of the laminated metal film including the first layer 40 of the Ti layer and the second layer 42 of the Cu layer is formed. The first layer 40 of the pad electrode 16 has the same material and the same film thickness as the first layer 30 of the interdigital electrode 14. The second layer 42 of the pad electrode 16 has the same material and the same film thickness as the second layer 32 of the interdigital electrode 14.

Figure 7C:
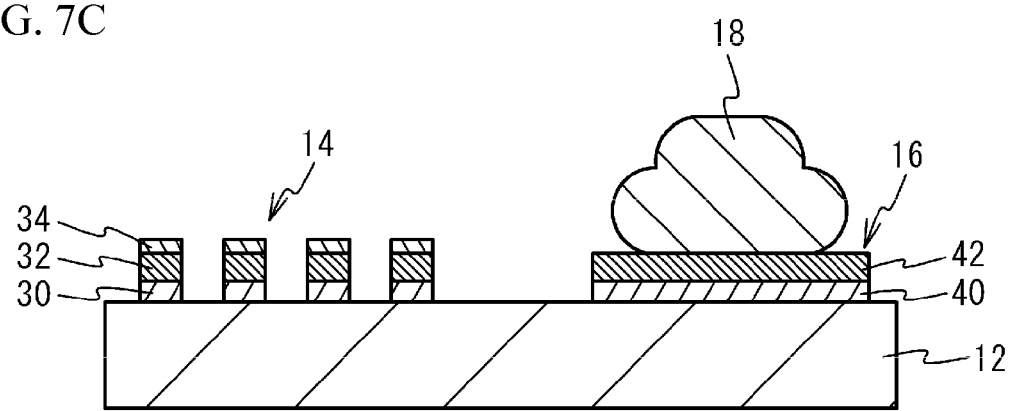

As illustrated in FIG. 7C, the bump 18 is formed on the upper surface of the second layer 42 of the pad electrode 16. The acoustic wave device of the first embodiment can be formed by including the above-mentioned process.

According to the first embodiment, the interdigital electrode 14 is a laminated metal film in which the electric resistivity of the material (Ti) of the third layer 34 that is the uppermost layer is larger than the electric resistivity of the material (Cu) of the second layer 32 located one layer lower than the uppermost layer. The pad electrode 16 has the same film structure as the film structure from the layer (i.e., the first layer 30) on the piezoelectric substrate 12 to the second layer 32 in the laminated metal film of the interdigital electrode 14. Then, the upper surface of the second layer 42 corresponding to the second layer 32 of the interdigital electrode 14 is exposed. Thus, the pad electrode 16 is configured so that the uppermost layer having a high electric resistivity is removed from the laminated metal film of the interdigital electrode 14. Therefore, the electric resistance of the pad electrode 16 in the direction perpendicular to the piezoelectric substrate 12 (i.e., the signal taking direction) can be suppressed, compared with a case where the pad electrode and the interdigital electrode have the same film structure as described in the comparative example 1. Therefore, the insertion loss of the filter can be suppressed. Even when desired materials to be used for the interdigital electrode 14 are selected in consideration of the power durability, the characteristics or the like, for example, the electric resistance of the pad electrode 16 in the direction perpendicular to the piezoelectric substrate 12 can be suppressed.

As explained by FIGS. 6A to 7C, the acoustic wave device 10 of the first embodiment can be formed by including the following manufacturing process. The laminated metal film in which the electric resistivity of the material of the uppermost layer (i.e., the Ti layer 58) is larger than the electric resistivity of the material of the layer (i.e., the Cu layer 56) located one layer lower than the uppermost layer is formed on the piezoelectric substrate 12. The interdigital electrode 14 made of the laminated metal film, and the metal pattern 60 that is electrically connected to the interdigital electrode 14 and made of the laminated metal film are formed at the same time (FIGS. 6B and 6C). Then, the uppermost layer (i.e., the Ti layer 58) of the metal pattern 60 is removed, the layer (i.e., the Cu layer 56) located one layer lower than the uppermost layer is exposed, and hence the pad electrode 16 electrically connected to the interdigital electrode 14 is formed (FIGS. 7A and 7B). According to the manufacturing method, the pad electrode 16 is formed by removing the uppermost layer having the high electric resistivity from the metal pattern 60 having the same film structure as the interdigital electrode 14. Therefore, the electric resistance of the pad electrode 16 in the direction perpendicular to the piezoelectric substrate 12 can be suppressed, compared with the case where the pad electrode and the interdigital electrode have the same film structure as described in the comparative example 1.

Second Embodiment

Figure 8:
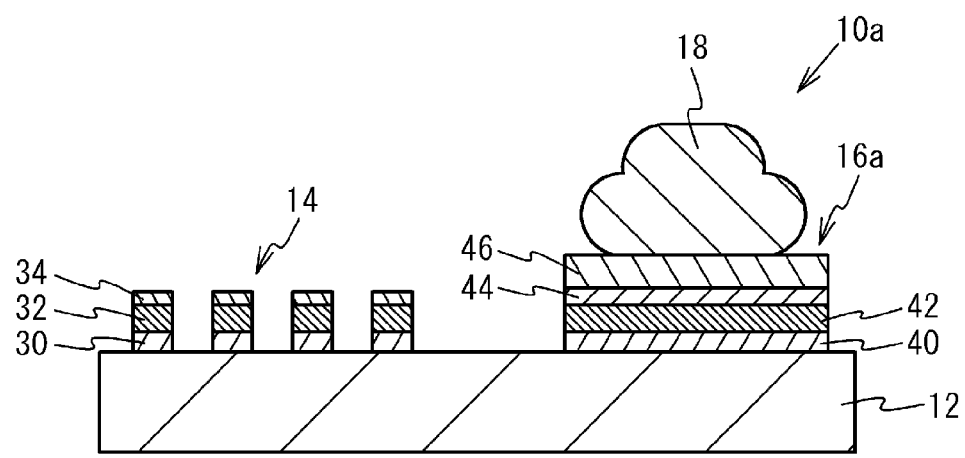
FIG. 8 is a cross-sectional view illustrating an acoustic wave device according to a second embodiment.

FIG. 8 is a cross-sectional view illustrating an acoustic wave device according to a second embodiment. In an acoustic wave device 10a of the second embodiment, a pad electrode 16a is provided with a third layer 44 and a fourth layer 46 on an upper surface of the second layer 42 in this order, as illustrated in FIG. 8. The third layer 44 is a Cr layer having a film thickness of about 100 nanometers, for example. The fourth layer 46 is an Au layer having a film thickness of about 100 nanometers, for example. The bump 18 is an Au bump, for example, and provided on an upper surface of the fourth layer 46 of the pad electrode 16a. The third layer 44 of the pad electrode 16a is provided, for adherence with the second layer 42. The fourth layer 46 is provided, for adherence with the bump 18. Since the other configuration of the acoustic wave device 10a is the same as corresponding configuration in FIG. 5 of the first embodiment, a description thereof is omitted.

Figure 9A:
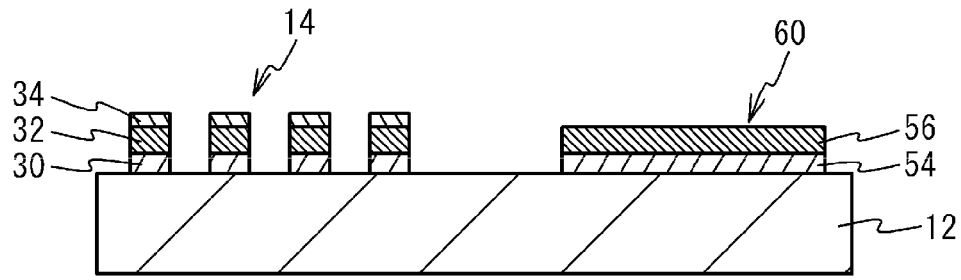
FIGS. 9A to 9D are cross-sectional views illustrating a method for manufacturing the acoustic wave device according to the second embodiment.

FIGS. 9A to 9D are cross-sectional views illustrating a method for manufacturing the acoustic wave device according to the second embodiment. First, the process in FIGS. 6A to 7A of the first embodiment is performed. Then, the resist pattern 62 is removed. The interdigital electrode 14 of the laminated metal film including the first layer 30 of the Ti layer, the second layer 32 of the Cu layer and the third layer 34 of the Ti layer, and the metal pattern 60 of the laminated metal film including the Ti layer 54 and the Cu layer 56 are formed on the piezoelectric substrate 12, as illustrated in FIG. 9A.

Figure 9B:
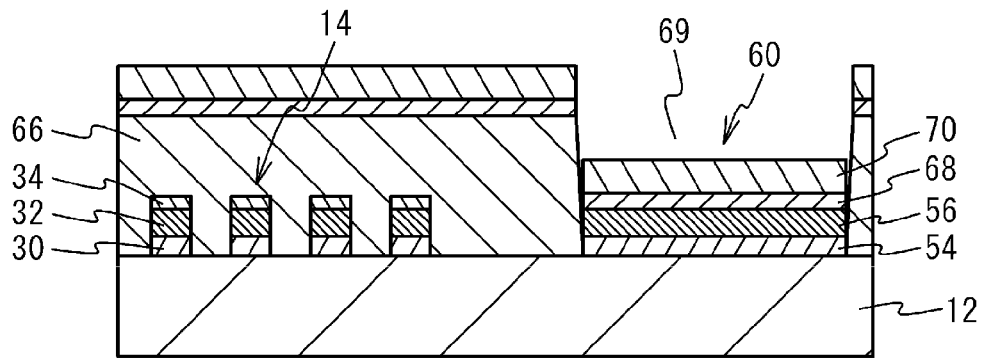

As illustrated in FIG. 9B, a resist pattern 66 that has an opening 69 on the metal pattern 60 and covers the other region is formed on the piezoelectric substrate 12. The opening 69 of the resist pattern 66 is opened so as to expose the whole upper surface of the metal pattern 60, for example. Then, a Cr layer 68 and an Au layer 70 are deposited on the piezoelectric substrate 12 in this order by using the vapor deposition method, for example. The Cr layer 68 and the Au layer 70 are formed on the resist pattern 66, and also formed on the metal pattern 60 in the opening 69 of the resist pattern 66.

Figure 9C:
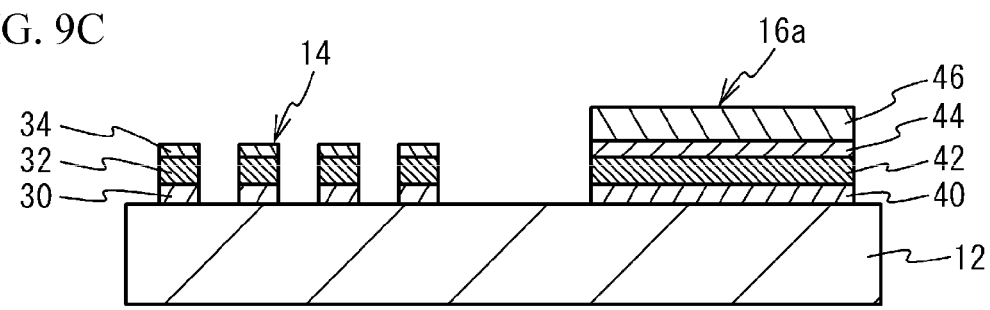

As illustrated in FIG. 9C, the resist pattern 66, and the Cr layer 68 and the Au layer 70 formed thereon are removed by the lift-off. Thereby, the pad electrode 16a of the laminated metal film including the first layer 40 of the Ti layer, the second layer 42 of the Cu layer, the third layer 44 of the Cr layer and the fourth layer 46 of the Au layer is formed.

Figure 9D:
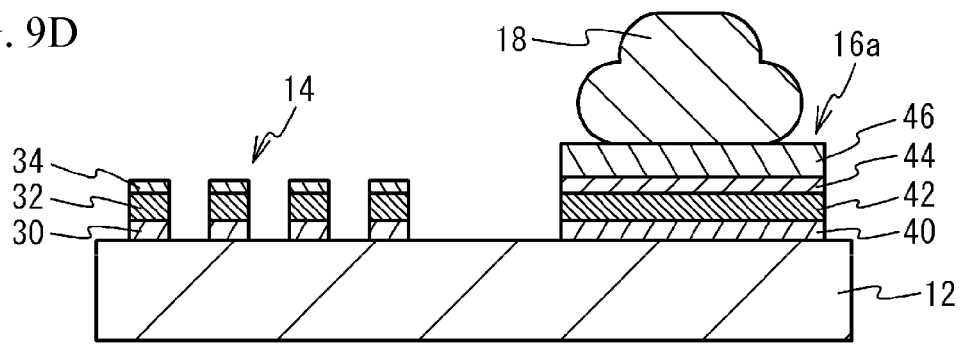

As illustrated in FIG. 9D, the bump 18 is formed on the upper surface of the fourth layer 46 of the pad electrode 16a. The acoustic wave device of the second embodiment can be formed by including the above-mentioned process.

According to the second embodiment, the pad electrode 16a has the same film structure as the film structure from the layer (i.e., the first layer 30) on the piezoelectric substrate 12 to the second layer 32 in the laminated metal film of the interdigital electrode 14, as illustrated in FIG. 8. In addition, the third layer 44 and the fourth layer 46 made of materials different from the material of the third layer 34 of the interdigital electrode 14 are provided on the second layer 42 corresponding to the second layer 32 of the interdigital electrode 14. When the bump 18 is made of the Au bump as explained also in the comparative example 2, it is desirable that the bump 18 is provided on the fourth layer 46 made of the Au layer in view of the adherence. Moreover, it is desirable that the third layer 44 and the fourth layer 46 are provided in order to suppress the oxidation of the second layer 42 made of the Cu layer. The pad electrode 106a of the comparative example 2 has the film structure in which another layer is further deposited on the laminated metal film having the same film structure as the interdigital electrode 104. On the other hand, the pad electrode 16a of the second embodiment has the film structure in which another layers are further deposited on the laminated metal film of the interdigital electrode 14 from which the uppermost layer having the high electric resistivity is removed. Therefore, the second embodiment can suppress the electric resistance of the pad electrode 16a in the direction perpendicular to the piezoelectric substrate 12, compared with the comparative example 2.

It is desirable that the layers (i.e., the third layer 44 and the fourth layer 46) which are provided on the second layer 42 of the pad electrode 16a and made of the materials different from the material of the uppermost layer of the interdigital electrode 14, are made of the materials having electric resistivities smaller than the electric resistivity of the uppermost layer of the interdigital electrode 14, in order to suppress the electric resistance of the pad electrode 16a in the direction perpendicular to the piezoelectric substrate 12.

As explained by FIGS. 6A to 7A and FIGS. 9A to 9D, the acoustic wave device 10a of the second embodiment can be formed by including the following manufacturing process. The laminated metal film in which the electric resistivity of the material of the uppermost layer (i.e., the Ti layer 58) is larger than that of the material of the layer (i.e., the Cu layer 56) located one layer lower than the uppermost layer is formed on the piezoelectric substrate 12. The interdigital electrode 14 made of the laminated metal film, and the metal pattern 60 that is electrically connected to the interdigital electrode 14 and made of the laminated metal film are formed at the same time (FIGS. 6B and 6C). The uppermost layer (i.e., the Ti layer 58) of the metal pattern 60 is removed and the layer (i.e., the Cu layer 56) located one layer lower than the uppermost layer is exposed (FIG. 9A). Then, the layers (i.e., the Cr layer 68 and the Au layer 70) made of the materials different from the material of the uppermost layer (i.e., the Ti layer 58) are formed on the exposed Cu layer 56 of the metal pattern 60, and the pad electrode 16a electrically connected to the interdigital electrode 14 is formed (FIGS. 9B and 9C). According to the manufacturing method, when the pad electrode 16a is formed, the uppermost layer having the high electric resistivity is removed from the metal pattern 60 having the same film structure as the interdigital electrode 14, thereby suppressing the electric resistance of the pad electrode 16a in the direction perpendicular to the piezoelectric substrate 12, compared with the comparative example 2.

The second embodiment explains that the third layer 44 of the Cr layer and the fourth layer 46 of the Au layer are provided on the second layer 42 of the pad electrode 16a in the view of adherence when the bump 18 is the Au bump. However, the bump 18 is not limited to the Au bump, and may be a solder bump (including a solder ball). In this case, a nickel (Ni) layer, for example, which functions as a barrier layer may be provided on the second layer 42 of the pad electrode 16a.

Third Embodiment

Figure 10:
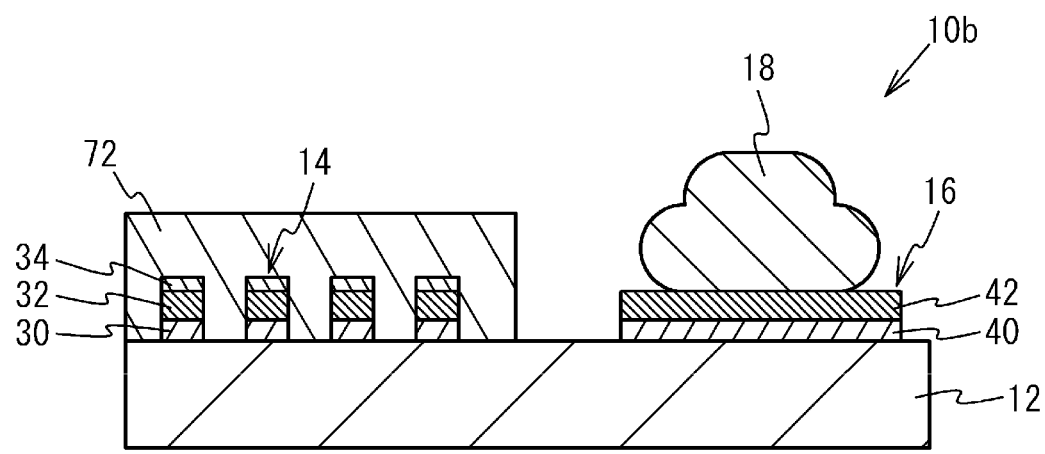
FIG. 10 is a cross-sectional view illustrating an acoustic wave device according to a third embodiment.

FIG. 10 is a cross-sectional view illustrating an acoustic wave device according to a third embodiment. In an acoustic wave device 10b of the third embodiment, a dielectric film 72 has an elastic constant including a temperature coefficient of a sign opposite to a sign of the temperature coefficient in the elastic constant of the piezoelectric substrate 12, and the dielectric film 72 is provided on the piezoelectric substrate 12 so as to cover the interdigital electrode 14, as illustrated in FIG. 10. The dielectric film 72 is a silicon dioxide film, for example, but it may be a silicon oxide film in which other elements, such as fluorine, are doped, for example. That is, the dielectric film 72 is a film composed mainly of silicon oxide. Since the other configuration of the acoustic wave device 10b is the same as corresponding configuration in FIG. 4 of the first embodiment, a description thereof is omitted.

The acoustic wave device 10b of the third embodiment can be formed by including the following manufacturing process. First, the process of FIGS. 6A to 7B of the first embodiment is performed. Next, the dielectric film 72 which covers the interdigital electrode 14 or the like is deposited on the piezoelectric substrate 12, and then the patterning of the dielectric film 72 is performed to make the dielectric film 72 a desired shape for covering the interdigital electrode 14. Then, the bump 18 is formed on the upper surface of the second layer 42 of the pad electrode 16.

According to the third embodiment, the dielectric film 72 has the elastic constant including the temperature coefficient of the sign opposite to the sign of the temperature coefficient in the elastic constant of the piezoelectric substrate 12, and the dielectric film 72 is provided so as to cover the interdigital electrode 14. Therefore, it is possible to suppress the electric resistance of the pad electrode 16 in the direction perpendicular to the piezoelectric substrate 12, and further to improve a temperature characteristic of the acoustic wave device 10b.

Fourth Embodiment

Figure 11:
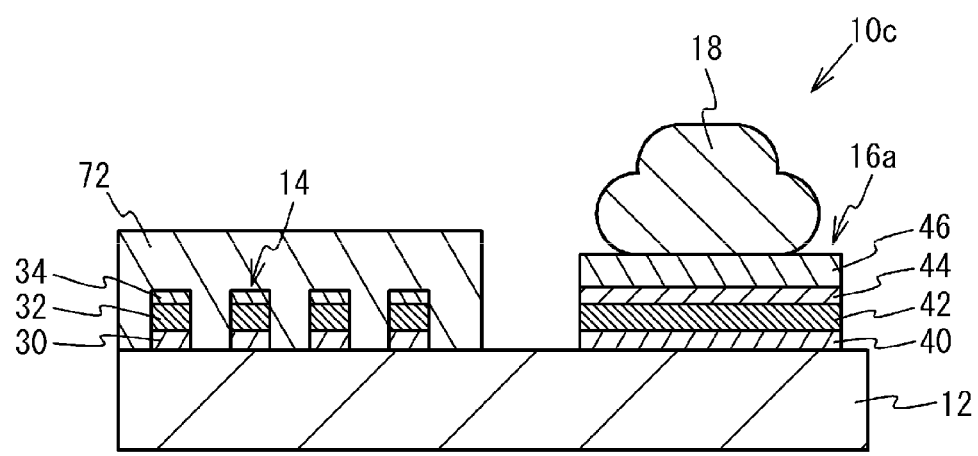
FIG. 11 is a cross-sectional view illustrating an acoustic wave device according to a fourth embodiment.

FIG. 11 is a cross-sectional view illustrating an acoustic wave device according to a fourth embodiment. In an acoustic wave device 10c of the fourth embodiment, the dielectric film 72 has the elastic constant including the temperature coefficient of the sign opposite to the sign of the temperature coefficient in the elastic constant of the piezoelectric substrate 12, and the dielectric film 72 is provided on the piezoelectric substrate 12 so as to cover the interdigital electrode 14, as illustrated in FIG. 11. Since the other configuration of the acoustic wave device 10c is the same as corresponding configuration in FIG. 8 of the second embodiment, a description thereof is omitted.

The acoustic wave device 10c of the fourth embodiment can be formed by including the following manufacturing process. First, the process of FIGS. 6A to 7A of the first embodiment and the process of FIG. 9A to 9C of the second embodiment are performed. Next, the dielectric film 72 which covers the interdigital electrode 14 or the like is deposited on the piezoelectric substrate 12, and then the patterning of the dielectric film 72 is performed to make the dielectric film 72 a desired shape for covering the interdigital electrode 14. Then, the bump 18 is formed on the upper surface of the fourth layer 46 of the pad electrode 16a.

Also in the fourth embodiment, the dielectric film 72 covering the interdigital electrode 14 is provided. Therefore, it is possible to suppress the electric resistance of the pad electrode 16a in the direction perpendicular to the piezoelectric substrate 12, and further to improve a temperature characteristic of the acoustic wave device 10c.

Fifth Embodiment

Figure 12:
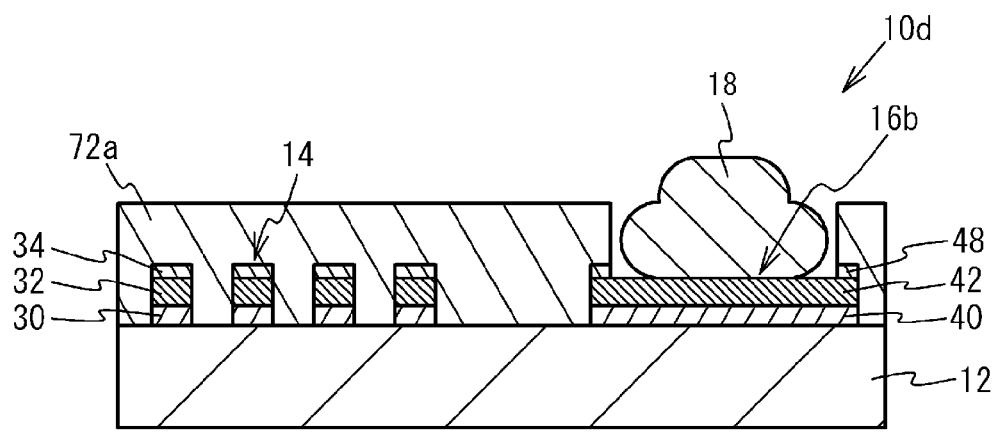
FIG. 12 is a cross-sectional view illustrating an acoustic wave device according to a fifth embodiment.

FIG. 12 is a cross-sectional view illustrating an acoustic wave device according to a fifth embodiment. In an acoustic wave device 10d of the fifth embodiment, a dielectric film 72a covering the interdigital electrode 14 extends to a pad electrode 16b and covers an edge portion of the pad electrode 16b, as illustrated in FIG. 12. The pad electrode 16b has a layer 48 that is provided on the second layer 42 and provided on the edge portion of the pad electrode 16b covered by the dielectric film 72a. The layer 48 has the same material and the same film thickness as the third layer 34 of the interdigital electrode 14. Since the other configuration of the acoustic wave device 10d is the same as corresponding configuration in FIG. 4 of the first embodiment, a description thereof is omitted.

Figure 13A:
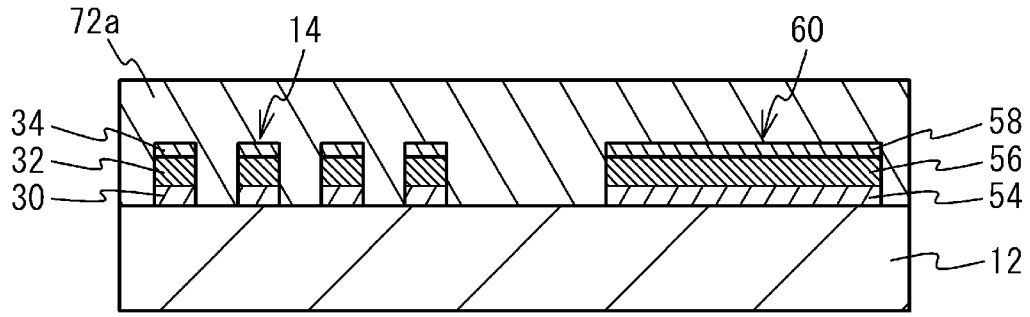
FIGS. 13A to 13D are cross-sectional views illustrating a method for manufacturing the acoustic wave device according to the fifth embodiment.

FIGS. 13A to 13D are cross-sectional views illustrating a method for manufacturing the acoustic wave device according to the fifth embodiment. First, the process of FIGS. 6A to 6C of the first embodiment is performed. Then, the dielectric film 72a covering the interdigital electrode 14 and the metal pattern 60 is deposited on the piezoelectric substrate 12 by a sputtering method, for example, as illustrated in FIG. 13A.

Figure 13B:
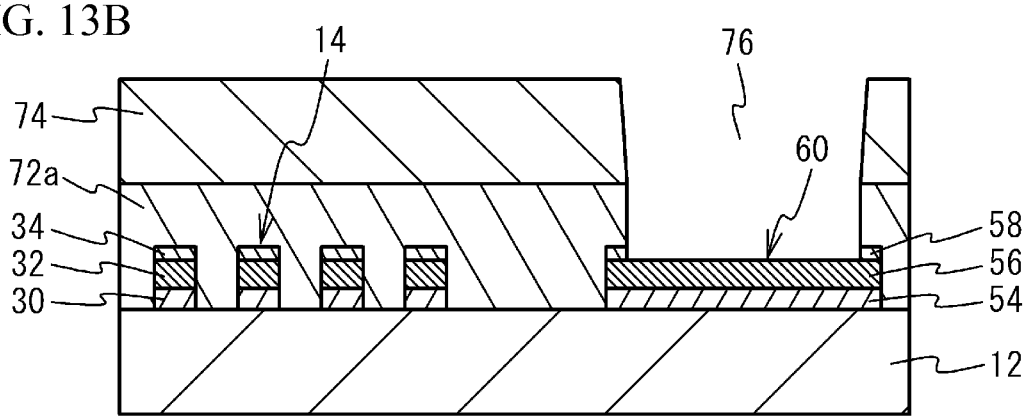

As illustrated in FIG. 13B, a resist pattern 74 having an opening 76 on the metal pattern 60 is formed on the dielectric film 72a. The resist pattern 74 covers an edge portion of the metal pattern 60, and has the opening 76 on a portion inside the edge portion of the metal pattern 60. Etching is performed on the dielectric film 72a using the resist pattern 74 as a mask, and the dielectric film 72a on the metal pattern 60 is removed. Next, etching is continuously performed on the metal pattern 60 using the resist pattern 74 as the mask, and the Ti layer 58 which is the uppermost layer of the metal pattern 60 is removed. Since the resist pattern 74 covers the edge portion of the metal pattern 60, the Ti layer 58 remains on the edge portion of the metal pattern 60 and the dielectric film 72a remains on the Ti layer 58. The etching for the dielectric film 72a and the metal pattern 60 may use the dry etching or the wet etching. For example, the etching of the dielectric film 72a may be performed by a reactive ion etching (RIE) with a fluorine-based gas, and the etching of the metal pattern 60 may be continuously performed to remove the Ti layer 58 without taking the piezoelectric substrate 12 out from an etching device by making etching time for this etching long. Moreover, the etching may use ion milling using a rare gas, such as an argon (Ar) gas, in substitution for the reactive ion etching.

Figure 13C:
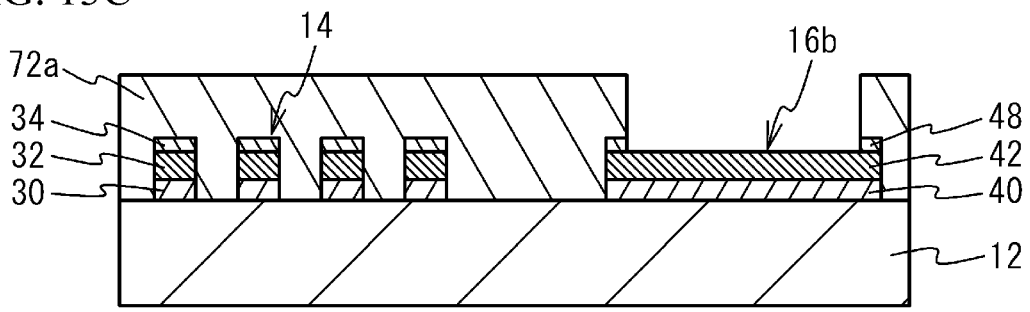

As illustrated in FIG. 13C, the resist pattern 74 is removed. Thereby, the pad electrode 16b of the laminated metal film is formed. In the laminated metal film, the first layer 40 of the Ti layer and the second layer 42 of the Cu layer are laminated on the piezoelectric substrate 12, and the layer 48 which is the Ti layer is provided on the edge portion of the second layer 42.

Figure 13D:
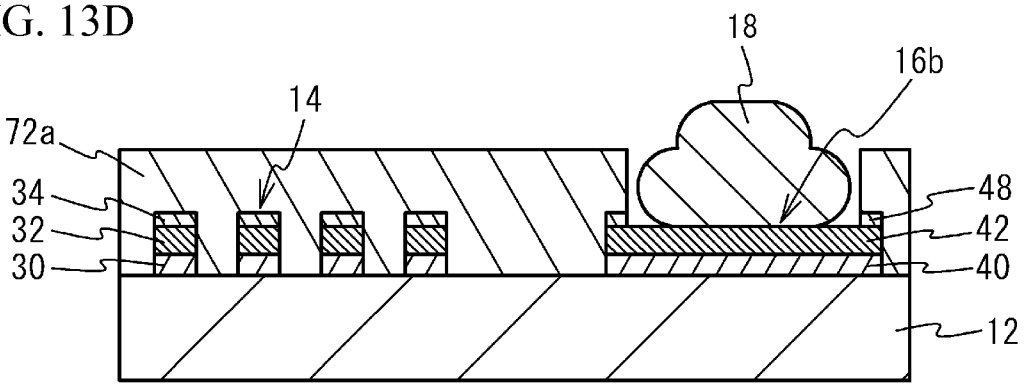

As illustrated in FIG. 13D, the bump 18 is formed on the upper surface of the second layer 42 of the pad electrode 16b. The acoustic wave device of the fifth embodiment can be formed by including the above-mentioned process.

Also in the fifth embodiment, the dielectric film 72a has the elastic constant including the temperature coefficient of the sign opposite to the sign of the temperature coefficient in the elastic constant of the piezoelectric substrate 12, and the dielectric film 72a is provided so as to cover the interdigital electrode 14. Therefore, it is possible to suppress the electric resistance of the pad electrode 16b in the direction perpendicular to the piezoelectric substrate 12, and further to improve the temperature characteristic of the acoustic wave device 10d.

In the fifth embodiment, the dielectric film 72a which covers the interdigital electrode 14 and the metal pattern 60, and has the elastic constant including the temperature coefficient of the sign opposite to the sign of the temperature coefficient in the elastic constant of the piezoelectric substrate 12 is provided, as illustrated in FIG. 13A. As illustrated in FIG. 13B, the dielectric film 72a on the metal pattern 60 and the uppermost layer (i.e., the Ti layer 58) of the metal pattern 60 are continuously removed using the same resist pattern 74, and the layer (i.e., the Cu layer 56) located one layer lower than the uppermost layer of the metal pattern 60 is exposed. According to the manufacturing method, after the removal of the dielectric film 72a, the uppermost layer of the metal pattern 60 is continuously removed to form the pad electrode 16b. Therefore, the increment of the manufacturing cost can be suppressed.

Sixth Embodiment

Figure 14:
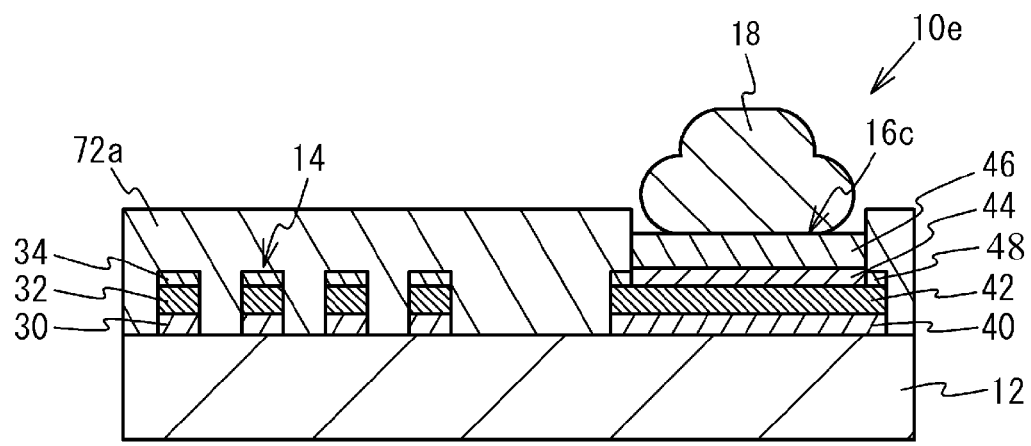
FIG. 14 is a cross-sectional view illustrating an acoustic wave device according to a sixth embodiment.

FIG. 14 is a cross-sectional view illustrating an acoustic wave device according to a sixth embodiment. In an acoustic wave device 10e of the sixth embodiment, a pad electrode 16c is a portion inside the layer 48 provided on the edge portion of the second layer 42. In the pad electrode 16c, the third layer 44 and the fourth layer 46 are provided on the upper surface of the second layer 42 in this order. The third layer 44 is the Cr layer, for example. The fourth layer 46 is the Au layer, for example. The bump 18 is provided on the upper surface of the fourth layer 46 of the pad electrode 16c. Since other configuration is the same as corresponding configuration in FIG. 12 of the fifth embodiment, a description thereof is omitted.

Figure 15A:
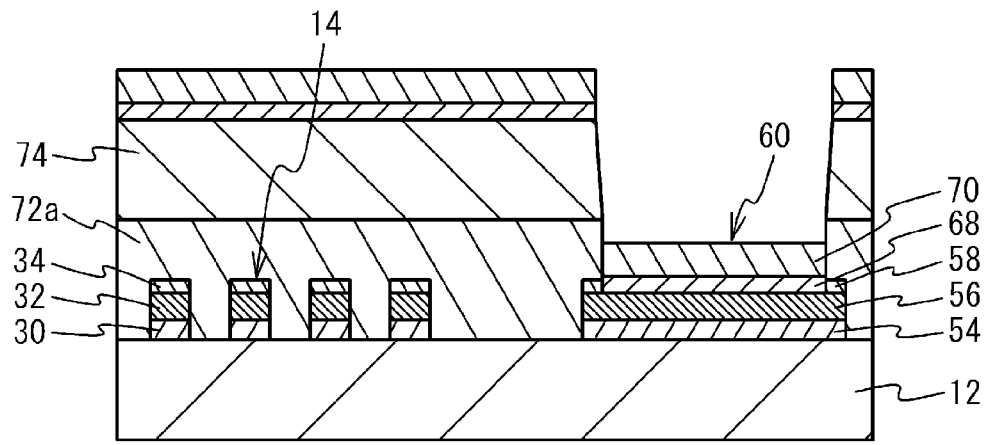
FIGS. 15A to 15C are cross-sectional views illustrating a method for manufacturing the acoustic wave device according to the sixth embodiment.
Figure 15B:
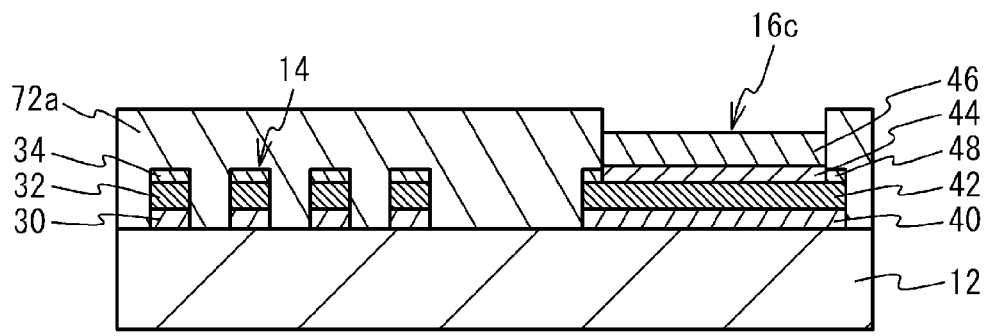
Figure 15C:
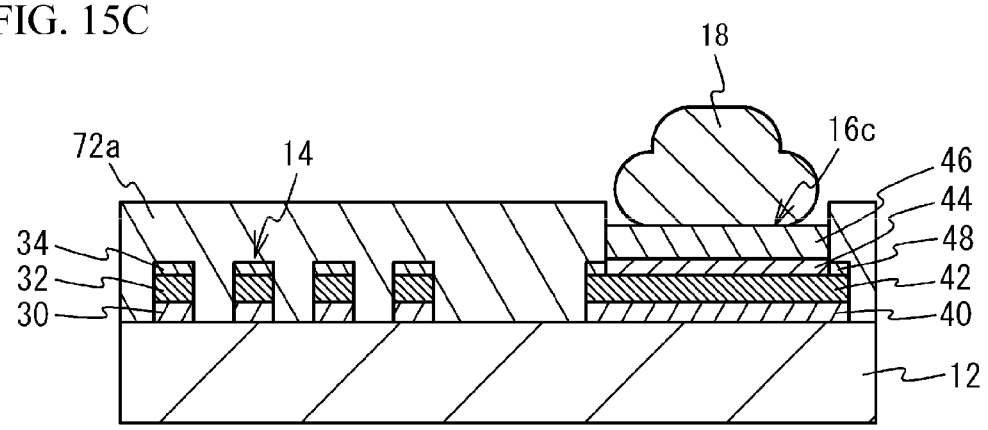

FIGS. 15A to 15C are cross-sectional views illustrating a method for manufacturing the acoustic wave device according to the sixth embodiment. First, the process of FIGS. 6A to 6C of the first embodiment and the process of FIGS. 13A and 13B of the fifth embodiment are performed. Then, the Cr layer 68 and the Au layer 70 are deposited on the piezoelectric substrate 12 in this order by using the vapor deposition method, for example, as illustrated in FIG. 15A.

As illustrated in FIG. 15B, the resist pattern 74, and the Cr layer 68 and the Au layer 70 formed thereon are removed by the lift-off. Thereby, the pad electrode 16c of the laminated metal film is formed. In the laminated metal film, the first layer 40 of the Ti layer and the second layer 42 of the Cu layer are laminated on the piezoelectric substrate 12, the layer 48 made of the Ti layer is provided on the edge portion of the second layer 42, and the third layer 44 of the Cr layer and the fourth layer 46 of the Au layer are provided in this order on the second layer 42 of the portion inside the layer 48.

As illustrated in FIG. 15C, the bump 18 is formed on the upper surface of the fourth layer 46 of the pad electrode 16c. The acoustic wave device of the sixth embodiment can be formed by including the above-mentioned process.

According to the sixth embodiment, it is possible to suppress the increment of the manufacturing cost, to suppress the electric resistance of the pad electrode 16c in the direction perpendicular to the piezoelectric substrate 12, and to improve the temperature characteristic of the acoustic wave device 10e, as with the fifth embodiment.

Although the fifth and the sixth embodiments explain that the dielectric film 72a covers the edge portions of the pad electrodes 16b and 16c, the dielectric film 72a does not need to cover the edge portions of the pad electrodes 16b and 16c. In this case, the layer 48 is not formed on the edge portion of the second layer 42 of the pad electrodes 16b and 16c.

Although the first to the sixth embodiments explain that the uppermost layer of the interdigital electrode 14 is the Ti layer and the layer located one layer lower than the uppermost layer is the Cu layer, the first to the sixth embodiments are not limited to this. As long as the electric resistivity of the material of the uppermost layer is larger than that of the material of the layer located one layer lower than the uppermost layer, a combination of the other materials may be used as the materials of the uppermost layer and the layer located one layer lower than the uppermost layer. When the layer located one layer lower than the uppermost layer is the Cu layer, for example, the uppermost layer may be the Cr layer, the Ni layer, a platinum (Pt) layer, a molybdenum (Mo) layer, the Au layer, a tungsten (W) layer, a tantalum (Ta) layer, or the like, other than the Ti layer. Moreover, when the layer located one layer lower than the uppermost layer is an Al layer, for example, the uppermost layer may be the Ti layer, the Cr layer, the Ni layer, the Pt layer, the Mo layer, the Au layer, the W layer, the Ta layer, or the like. Although the first to the sixth embodiments explain that the acoustic wave device is mounted on the mounting substrate by the bump 18, the acoustic wave device may be connected to the mounting substrate by a wire in substitution for the bump.

Although the first to the sixth embodiments explain that the acoustic wave device is the ladder type filter, the acoustic wave device may be another filter such as a multiple mode type filter, a resonator, or a combination of the multiple mode type filter and the resonator. Moreover, the acoustic wave device of the first to the sixth embodiments is not limited to an acoustic wave device using a surface acoustic wave, and may be an acoustic wave device using a love wave, an acoustic boundary wave, or the like.

Although the embodiments of the present invention have been described in detail, the present invention is not limited to these specific embodiments, and the various changes, substitutions, and alterations could be made hereto without departing from the spirit and scope of the invention.

What is claimed is:
1. An acoustic wave device comprising:
a piezoelectric substrate;
an interdigital electrode that is provided on the piezoelectric substrate and made of a laminated film, an electric resistivity of a material of an uppermost layer in the laminated film being larger than that of a material of a just-under layer located one layer lower than the uppermost layer;
a pad electrode that is provided on the piezoelectric substrate, electrically connected to the interdigital electrode and made of a film having a same film structure as a film structure from a lowermost layer to the just-under layer in the laminated film of the interdigital electrode, an upper surface of an uppermost layer in the film of the pad electrode corresponding to the just-under layer in the laminated film of the interdigital electrode being exposed; and
a bump provided in contact with the upper surface of the uppermost layer in the film of the pad electrode corresponding to the just-under layer in the laminated film of the interdigital electrode.

2. The acoustic wave device as claimed in claim 1, comprising:
a dielectric film that covers the interdigital electrode and has an elastic constant including a temperature coefficient of a sign opposite to a sign of a temperature coefficient in an elastic constant of the piezoelectric substrate.

3. The acoustic wave device as claimed in claim 2, wherein
the dielectric film is composed mainly of silicon oxide.

4. An acoustic wave device comprising:
a piezoelectric substrate;
an interdigital electrode that is provided on the piezoelectric substrate and made of a laminated film, an electric resistivity of a material of an uppermost layer in the laminated film being larger than that of a material of a just-under layer located one layer lower than the uppermost layer; and
a pad electrode that is provided on the piezoelectric substrate and electrically connected to the interdigital electrode, and includes a film having a same film structure as a film structure from a lowermost layer to the just-under layer in the laminated film of the interdigital electrode and a layer that is made of a material different from a material of the uppermost layer in the laminated film of the interdigital electrode and is provided in contact with an upper surface of an uppermost layer in the film of the pad electrode corresponding to the just-under layer in the laminated film of the interdigital electrode.

5. The acoustic wave device as claimed in claim 4, comprising;
a bump provided in contact with an upper surface of the layer of the pad electrode that is made of the material different from the material of the uppermost layer in the laminated film of the interdigital electrode.

6. The acoustic wave device as claimed in claim 4, comprising:
a dielectric film that covers the interdigital electrode and has an elastic constant including a temperature coefficient of a sign opposite to a sign of a temperature coefficient in an elastic constant of the piezoelectric substrate.

7. The acoustic wave device as claimed in claim 6, wherein
the dielectric film is composed mainly of silicon oxide.

* * * * *